US012777576B2

(12) United States Patent
Chu et al.

(10) Patent No.: US 12,777,576 B2
(45) Date of Patent: Oct. 27, 2026

(54) DUAL DIFFERENTIAL VIA DESIGN ON A PRINTED CIRCUIT BOARD

(71) Applicant: DELL PRODUCTS L.P., Round Rock, TX (US)

(72) Inventors: Chang-Kai Chu, Zhongli District (TW); Chang-Hsien Chen, New Taipei City (TW); Yi-Tang Chen, Xinzhuang (TW); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 229 days.

(21) Appl. No.: 18/736,959

(22) Filed: Jun. 7, 2024

(65) Prior Publication Data

US 2025/0380354 A1 Dec. 11, 2025

(51) Int. Cl.
*H05K 1/00* (2006.01)
*H05K 1/02* (2006.01)
*H05K 1/11* (2006.01)

(52) U.S. Cl.
CPC ......... *H05K 1/0245* (2013.01); *H05K 1/0298* (2013.01); *H05K 1/115* (2013.01); *H05K 2201/09536* (2013.01)

(58) Field of Classification Search
CPC .... H05K 1/0245; H05K 1/0251; H05K 1/115; H05K 1/0222; H05K 1/0228; H05K 1/116; H05K 1/0218; H05K 2201/09618; H05K 3/42; H05K 3/429; H05K 3/4015; H05K 1/0216; H05K 1/0219; H05K 2201/09236; H05K 1/0253; H05K 2201/09809; H05K 3/4038; H05K 1/0237; H05K 2201/09227; H05K 2201/09545; H05K 2201/09636; H05K 1/0231; H05K 1/0298; H05K 1/113; H05K 1/181; H05K 2201/09518; H05K 2201/09645; H05K 2203/0207; H05K 2203/0242; H05K 1/0213; H05K 1/024; H05K 1/0248; H05K 1/111; H05K 2201/09063; H05K 2201/093; H05K 2201/09336; H05K 2201/09454; H05K 2201/09609; H05K 2201/09627; H05K 2201/09681; H05K 2201/09718; H05K 2201/09845; H05K 2201/09854;
(Continued)

(56) References Cited

U.S. PATENT DOCUMENTS

| | | | | |
|---|---|---|---|---|
| 6,388,208 B1 * | 5/2002 | Kiani | H05K 1/0222 174/266 |
| 2007/0033457 A1 | 2/2007 | Park et al. | |
| 2019/0289710 A1 * | 9/2019 | Kumar | G06F 13/4282 |

* cited by examiner

*Primary Examiner* — Pete T Lee
(74) *Attorney, Agent, or Firm* — Larson Newman, LLP

(57) ABSTRACT

An information handling system includes a printed circuit board having first and second vias fabricated through the printed circuit board. The first via includes a first conductive metal plating and first and second via portions. The first via portion is connected to a first ground trace of the printed circuit board. The second via portion is connected to a first trace of a differential pair. The first and second via portions are formed in the first conductive metal plating. The second via includes a second conductive metal plating and third and fourth via portions. The third via portion is connected to a second ground trace the printed circuit board. The fourth via portion is connected to a second trace of the differential pair. The third and fourth via portions are formed in the second conductive metal plating.

20 Claims, 6 Drawing Sheets

(58) Field of Classification Search
CPC .......... H05K 2201/10015; H05K 2201/10159; H05K 3/0005; H05K 3/0047; H05K 3/4007; H05K 1/0224; H05K 1/0243; H05K 1/025; H05K 1/0265; H05K 1/0271; H05K 2201/0707; H05K 2201/0715; H05K 2201/0939; H05K 2201/09409; H05K 2201/09481; H05K 2201/09536; H05K 2201/0959; H05K 2201/0969; H05K 2201/09727; H05K 2201/09781; H05K 2201/10901; H05K 3/0035; H05K 3/0094; H05K 3/3436
See application file for complete search history.

DUAL DIFFERENTIAL VIA DESIGN ON A PRINTED CIRCUIT BOARD

FIELD OF THE DISCLOSURE

The present disclosure generally relates to information handling systems, and more particularly relates to a dual differential via design on a printed circuit board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a printed circuit board having first and second vias fabricated through the printed circuit board. The first via includes a first conductive metal plating and first and second via portions in the first conductive metal plating. The first via portion is connected to a first ground trace of the printed circuit board. The second via portion is connected to a first trace of a differential pair of the printed circuit board. The second via includes a second conductive metal plating and third and fourth via portions in the second conductive metal plating. The third via portion is connected to a second ground trace on the surface of the printed circuit board. The fourth via portion is connected to a second trace of the differential pair of the printed circuit board.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
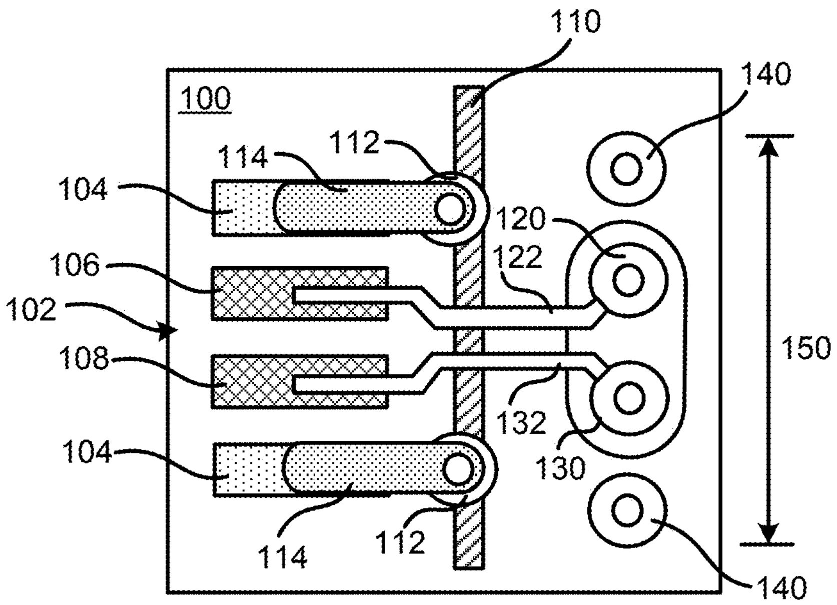
FIG. 1 (Prior Art)
FIG. 1 is a diagram of a portion of a printed circuit board with signal vias connected to pads of a differential pair according to prior art.
Figure 8:
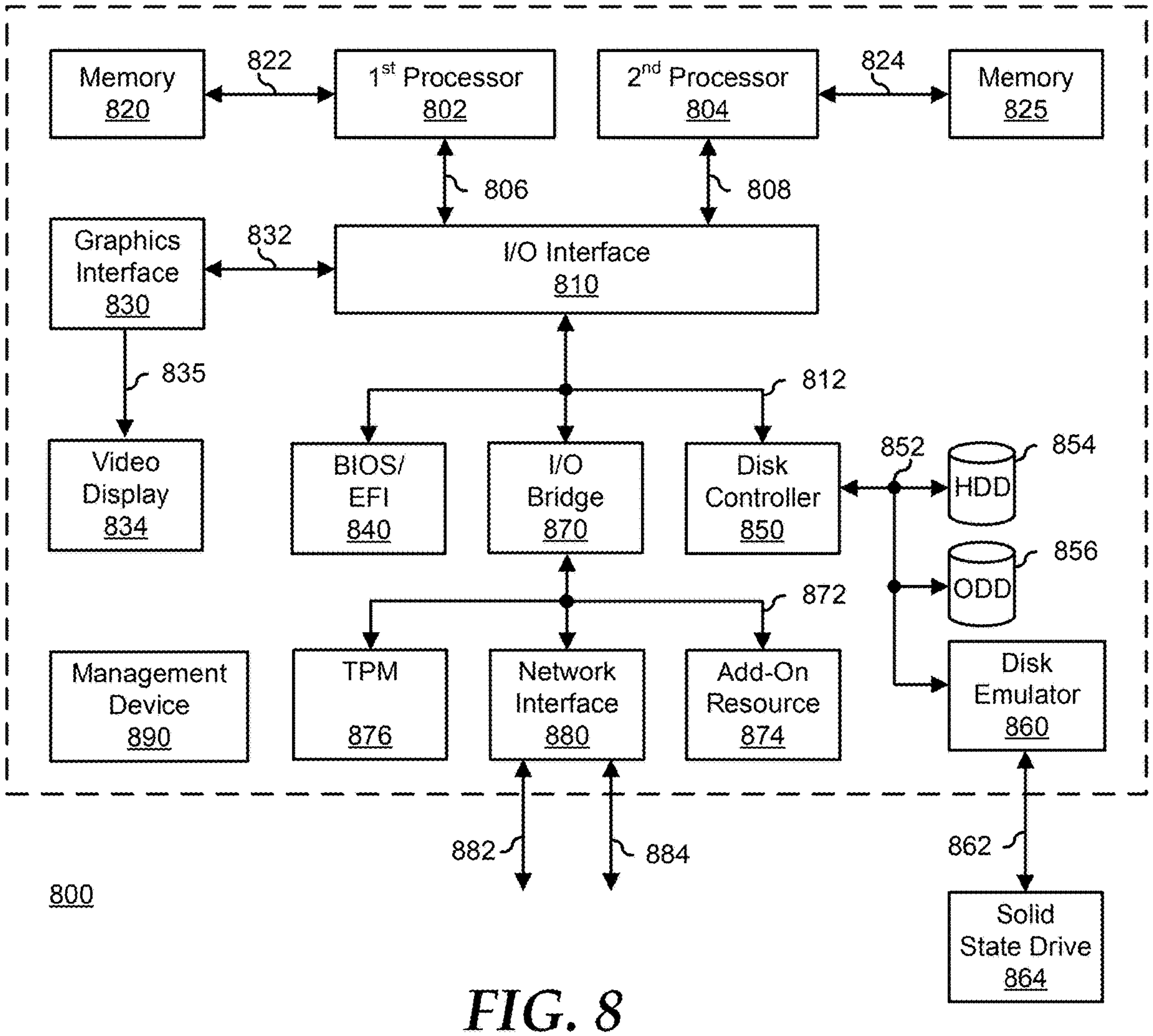
FIG. 8 is a block diagram of a general information handling system according to an embodiment of the present disclosure.

FIG. 1 illustrates a printed circuit board (PCB) 100 of an information handling system, such as information handling system 800 of FIG. 8, according to prior art in the field. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

PCB 100 includes a differential pair 102 and ground pads 104. Differential pair 102 includes pads 106 and 108. Each ground pad 104 may be physically and electrically coupled to a ground layer 110 of PCB 100 by a respective ground via 112 and ground trace 114. PCB 100 also includes signal vias 120 and 130. Signal via 120 is electrically and physically connected to pad 106 of differential pair 102 by a signal trace 122. Similarly, signal via 130 is electrically and physically connected to pad 108 of differential pair 102 by a signal trace 132. PCB 100 further includes ground vias 140 associated with signal vias 120 and 130. Ground vias 140, signal via 120, and signal via 130 may cover a particular length 150 on PCB 100.

In an example, a combination of ground pad 104, ground plane layer 110, ground via 112, and ground trace 114 may reduce crosstalk between differential pair 102 and an adjacent differential pair. The details of PCB manufacture, and particularly the forming of vias and traces on a PCB are known in the art and will not be further described herein, except as needed to illustrate the current embodiments.

PCB 100 may be utilized for transmission of high speed signals. In this situation, routing for the high speed signal on PCB 100 may need a lot of differential vias for signals. Additionally, PCB 100 may include a lot of ground vias to control a target impedance of a differential pair and to reduce crosstalk between adjacent differential pairs. The via design of PCB 100 may utilize via to via spacing to control the impedance of the differential pair, and may add one or more grounds vias to reduce crosstalk. This via design in PCB 100 may utilize a lot of routing space available in the PCB. In some cases, traditional differential via designs may exceed an available real estate for routing on PCB 100 when there is high density PCB routing.

Figure 2:
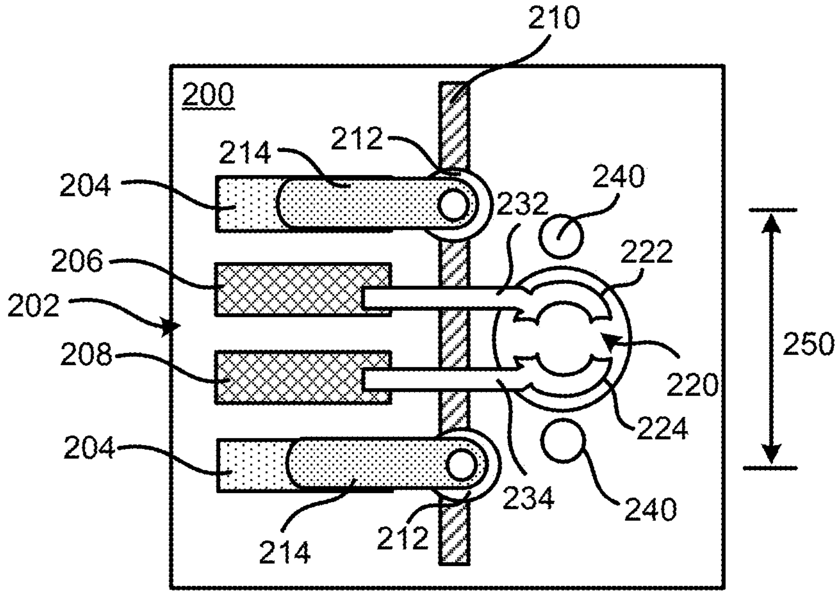
FIG. 2 (Prior Art)
FIG. 2 is a diagram of a portion of a printed circuit board with differential signal via connected to pads of a differential pair according to prior art.

FIG. 2 illustrates a portion of a PCB 200 of an information handling system, such as information handling system 800 of FIG. 8, according to prior art in the field. PCB 200 includes a differential pair 202 and ground pads 204. Differential pair 202 includes pads 206 and 208. Each ground pad 204 may be physically and electrically coupled to a ground layer 210 of PCB 200 by a respective ground via 212 and ground trace 214. PCB 200 also includes signal via 220, which in turn is divided into separate via portions 222 and 224. Signal via portion 222 is electrically and physically connected to pad 206 of differential pair 202 by a signal trace 232. Similarly, signal via portion 224 is electrically and physically connected to pad 208 of differential pair 202 by a signal trace 234. PCB 200 further includes ground vias 240 associated with signal via portions 222 and 224 of via 220. Ground vias 240, signal via 220 may cover a particular length 250 on PCB 200.

Signal via 220 (portions 222 and 224) and ground vias 212 and 240 are utilized to interconnect two or more different metal layers within PCB 200. Additionally, signal via 220 and ground vias 212 and 240 may be utilized to connect the two or more different metal layers within PCB 200 with metal traces and/or metal pads on a surface of the PCB, such as pads 204, 206, and 208. While portions 222 and 224 of signal via 220 are illustrated and described as connecting metal layers within PCB 200 to respective pads 206 and 208 via respective traces 232 and 234 on the surface of the PCB, traces 232 and 234 may be located within any layer within the PCB and portions 222 and 224 of signal via 220 may perform substantially similar functions.

In an example, signal via 220 with via portions 222 and 224 may create a smaller structure as compared to signal vias 120 and 130 of PCB 100 in FIG. 1. For example, length 150 consumed by ground vias 140 and signal vias 120 and 130 on PCB 100 of FIG. 1 is greater than length 250 consumed by ground vias 240 and signal via portions 222 and 224 of signal via 220 on PCB 200. Thus, the layout space of signal via 220 and ground vias 240 on PCB 200 is less than the layout space of signal vias 120 and 130 and ground vias 140 on PCB 100 of FIG. 1. In this example, the structure of signal via 220 with via portions 222 and 224 may enable a greater density of vias and signal traces on PCB 200 as compared to the density of vias and signal traces on PCB 100 of FIG. 1.

Figure 3:
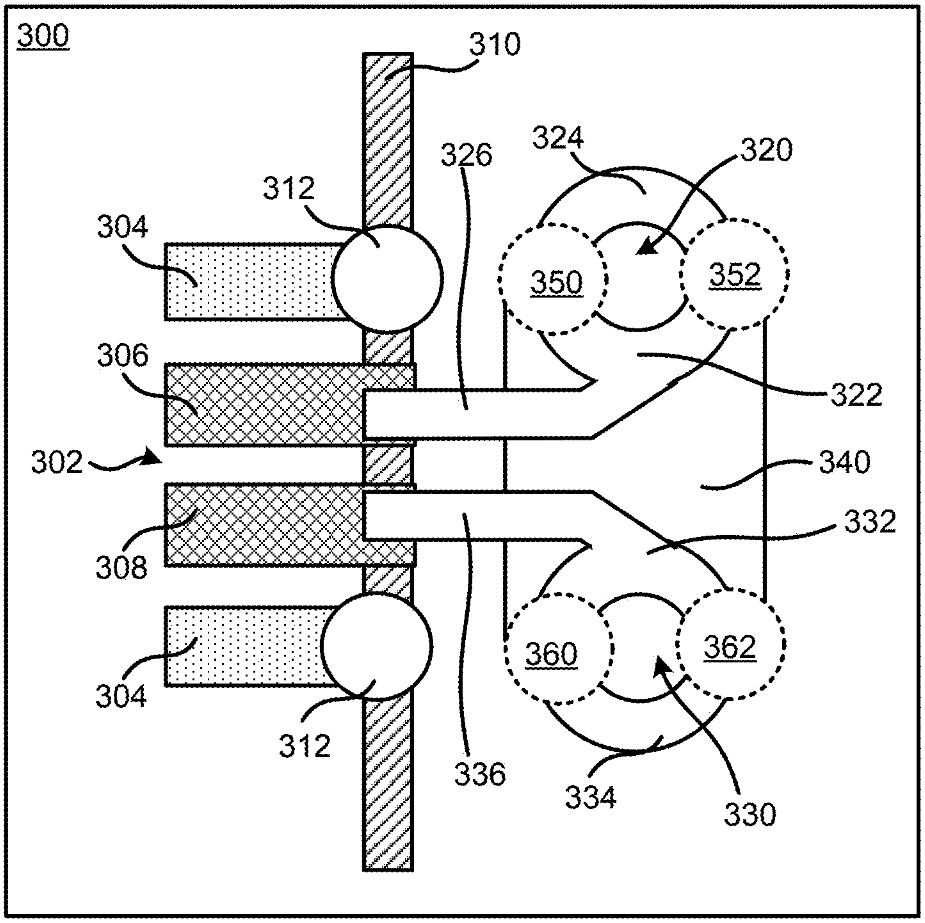
FIGS. 3 and 4 are diagrams of portions of a printed circuit board with differential signal vias connected to pads of a differential pair according to at least one embodiment of the present disclosure.
Figure 4:
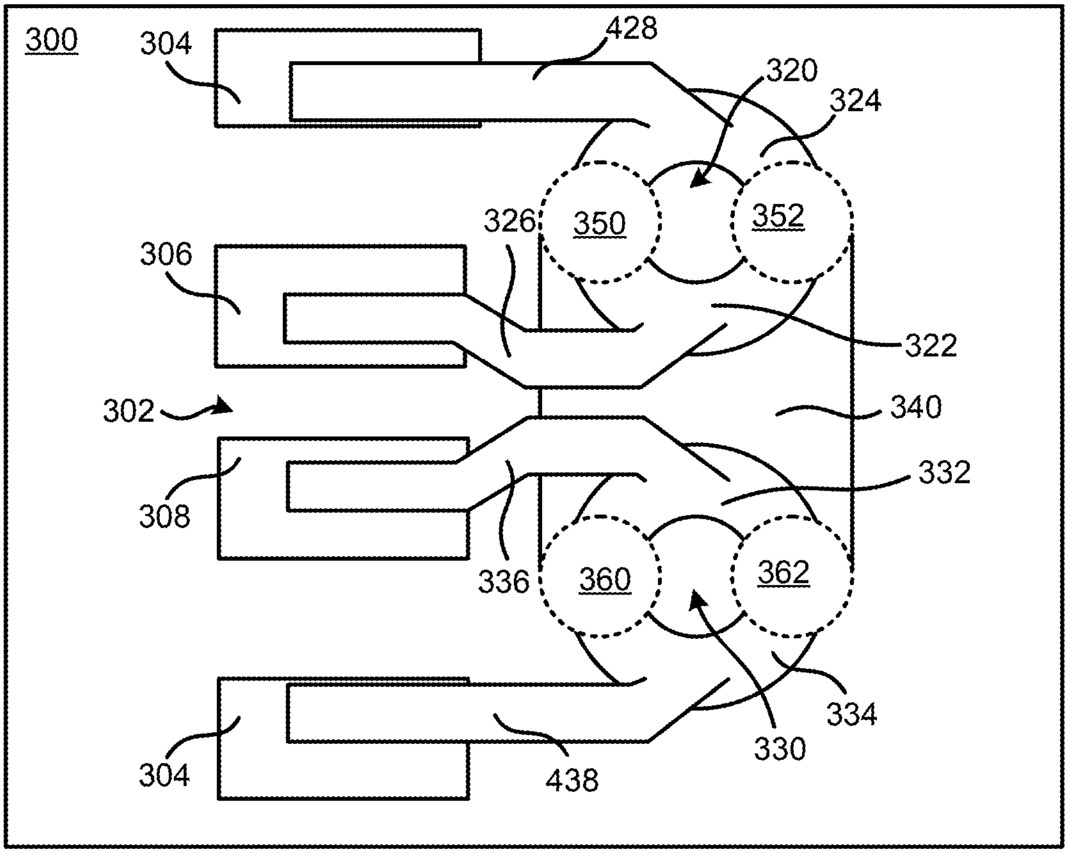

FIGS. 3 and 4 illustrate a portion of a PCB 300 of an information handling system, such as information handling system 800 of FIG. 8, according to at least one embodiment of the present disclosure. PCB 300 includes a differential pair 302 and ground pads 304. Differential pair 302 includes pads 306 and 308. Each ground pad 304 may be physically and electrically coupled to a ground layer 310 of PCB 300 by a respective ground via 312. Additionally, a different ground trace may be routed between a respective ground pad 304 and corresponding ground via 312. PCB 300 also includes vias 320 and 330. Via 320 is divided into separate via portions 322 and 324, and via 330 is divided into separate via portions 332 and 334. PCB 300 further includes an anti-pad 340. PCB 300 may include additional components without varying from the scope of this disclosure.

In an example, via 320 may be plated with any suitable conductive material including, but not limited to, copper, silver, gold, zinc, and nickel. The details of PCB manufacture, and particularly the forming of vias in a PCB are known in the art and will not be further described herein, except as needed to illustrate the current embodiments. After via 320 has been plated, two sections 350 and 352 of the plating of the via may be removed in any suitable manner. For example, a drill may be utilized to drill holes corresponding to sections 350 and 352 in via 320 as shown in FIG. 3. After sections 350 and 352 are removed from via 320, the via is separated into via portions 322 and 324. In an example, via portion 322 may be physically and electrically connected to differential trace 306 and a signal layer within PCB 300. Similarly, via portion 324 may be physically and electrically connected to ground trace 304 and a ground layer within PCB 300.

In an example, removed sections 350 and 352 would preferably be located along a line of symmetry for via 320, such that via portions 322 and 324 may be the same size. In an exemplary embodiment, the outer diameter of via 320 may be 25 mil and the diameter each of sections 350 and 352 may be 15 mil. In this embodiment, a distance from the center of section 350 to the center of section 352 may be 25 mil, a distance from the center of section 350 to the center of via 320 may be 12.5 mil, and a distance from the center of section 352 to the center of signal via 320 may be 12.5 mil. One of ordinary skill in the art would recognize that mil is a unit of measurement utilized in routing on PCBs, and one mil equals one-thousandth of an inch or two hundred fifty-four ten-thousandths of a millimeter.

However, the locations for a drill to remove sections 350 and 352 may vary slightly, within a tolerance of +/−2 mil, in one or more directions from a desired drilling location. For example, the drill hole for removed section 350 may be slightly to the one side of the line of symmetry for signal via 320, and the drill hole for removed section 352 may also be slightly to the same side of the line of symmetry as shown in FIG. 3. In this example, via portion 322 may include more of the plating of via 320 than via portion 324. In an example, a tolerance of the drill location for removed sections 350 and 352 may be such that both via portions 322 and 324 may always include enough of the plating of via 320 to have a desired impedance, such as 85 ohms +/−10%, and operate has needed for a differential pair.

In certain examples, via 330 may be plated with conductive material after via 330. After 330 has been plated, two sections 360 and 362 of the plating of the via may be removed in any suitable manner. For example, a drill may be utilized to drill holes corresponding to sections 360 and 362 in via 330 as shown in FIG. 3. After sections 360 and 362 are removed from via 330, the signal via is separated into via portions 332 and 334. In an example, via portion 332 may be physically and electrically connected to differential trace 308 and a signal layer within PCB 300. Similarly, via portion 334 may be physically and electrically connected to ground trace 304 and a ground layer within PCB 300.

In an example, removed sections 360 and 362 would preferably be located along a line of symmetry for via 330, such that via portions 332 and 334 may be the same size. In an exemplary embodiment, the outer diameter of via 330 may be 25 mil and the diameter each of sections 360 and 362 may be 15 mil. In this embodiment, a distance from the center of section 360 to the center of section 362 may be 25 mil, a distance from the center of section 360 to the center of via 330 may be 12.5 mil, and a distance from the center of section 362 to the center of signal via 330 may be 12.5 mil. One of ordinary skill in the art would recognize that mil is a unit of measurement utilized in routing on PCBs, and one mil equals one-thousandth of an inch or two hundred fifty four ten-thousandths of a millimeter.

However, the locations for a drill to remove sections 360 and 362 may vary slightly, within a tolerance of +/−2 mil, in one or more directions from a desired drilling location. For example, the drill hole for removed section 360 may be slightly to the one side of the line of symmetry for signal via 330, and the drill hole for removed section 362 may also be slightly to the same side of the line of symmetry as shown in FIG. 3. In this example, via portion 332 may include more of the plating of via 330 than via portion 334. In an example, a tolerance of the drill location for removed sections 360 and 362 may be such that both via portions 332 and 334 may always include enough of the plating of via 330 to have a desired impedance, such as 85 ohms +/−10%, and operate has needed for a differential pair.

In an example, via portion 322 may be a signal portion of via 320, and via portion 324 may be a ground portion of the via. Similarly, via portion 332 may be a signal portion of via 330, and via portion 334 may be a ground portion of the via. Based on this configuration of vias 320 and 330, each of the vias may include a via portion that is part of differential pair 302 (via portion 322 of via 320 and via portion 332 of via 330) and another via portion that is a ground for the differential pair (via portion 324 of via 320 and via portion 334 of via 330). Signal via portion 322 is electrically and physically connected to pad 306 of differential pair 302 by a signal trace 326, and signal via portion 332 is electrically and physically connected to pad 308 of differential pair 302 by a signal trace 336.

Via 320 (via portions 322 and 324), via 330 (via portions 332 and 334), and ground vias 312 are utilized to interconnect two or more different metal layers within PCB 300. Additionally, vias 320 and 330, and ground vias 312 may be utilized to connect the two or more different metal layers within PCB 300 with metal traces and/or metal pads on a surface of the PCB, such as pads 304, 306, and 308. While portions 322 and 332 of respective vias 320 and 330 are illustrated and described as connected metal layers within PCB 300 to respective pads 306 and 308 through respective traces 326 and 336 on the surface of the PCB, traces 326 and 336 may be located within any signal layer within the PCB and portions 322 and 332 of respective vias 320 and 330 may perform substantially similar functions without varying from the scope of this disclosure.

In an example, ground portion 324 of via 320 may connect with ground pad 304 in any suitable manner. For example, ground portion 324 may connect with ground pad 304 through ground layer 310 and ground via 312. In an example, ground portion 324 may connect with ground pad 304 through trace, such as trace 428 of FIG. 4. In certain examples, ground portion 334 of via 330 may connect with ground pad 304 in any suitable manner. For example, ground portion 334 may connect with ground pad 304 through ground layer 310 and ground via 312. In an example, ground portion 324 may connect with ground pad 304 through trace, such as trace 438 of FIG. 4.

In certain examples, anti-pad 340 may be located or configured in different manners based on locations of vias 320 and 330. As shown in FIG. 3, anti-pad 340 may be located under/around signal portion 322 of via 320, but not under/around ground portion 324 of via 320. Similarly, anti-pad 340 may be located under/around signal portion 332 of via 330, but not under/around ground portion 334 of via 330. In an example, anti-pad or isolation pad 340 may be a void around vias that appears when a via is routed through a plane layer. In certain examples, the shape of anti-pad 340 may differ as will be discussed with respect to FIGS. 5 and 6.

Figure 5:
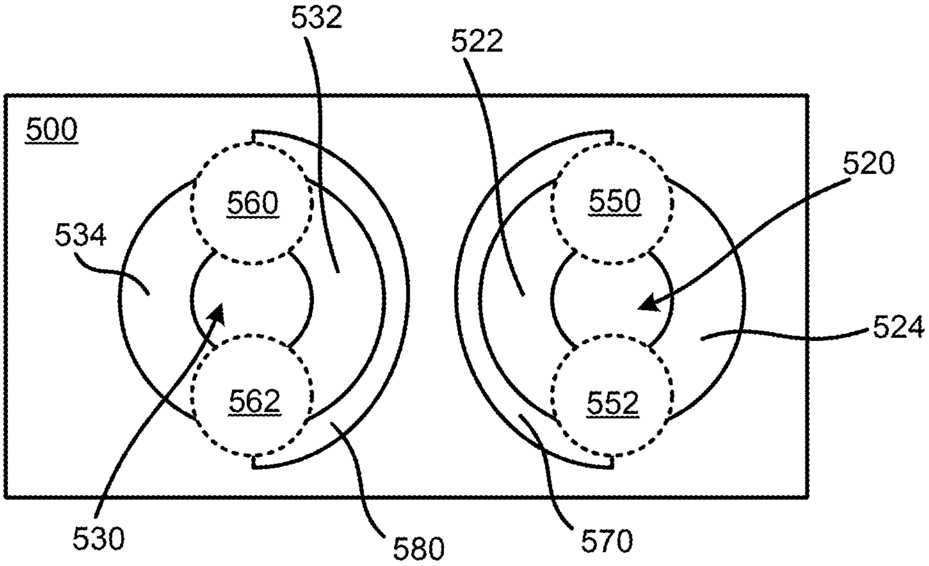
FIG. 5 is a diagram of a portion of a printed circuit board with differential signal vias having multiple anti-pads or voids according to at least one embodiment of the present disclosure.

FIG. 5 illustrates a PCB 500 according to an embodiment of this disclosure. PCB 500 may be substantially similar to PCB 300 of FIGS. 3 and 4. PCB 500 includes vias 520 and 530 and anti-pads or voids 570 and 580. Via 520 includes via portions 522 and 524, and via 530 includes via portions 532 and 534. As described above with respect to FIGS. 3 and 4, via portions 522 and 524 may be formed by removing sections 550 and 552 from a conductive plating of via 520. Similarly, via portions 532 and 534 may be formed by removing sections 560 and 562 from a conductive plating of the via. PCB 500 may include additional components without varying from the scope of this disclosure.

Via portion 522 may be connected electrically and physically to a signal trace and a signal pad of a differential pair, such as differential pair 302 of FIGS. 3 and 4, and via portion 524 may be connected electrically and physically to the other signal trace and signal pad of the differential pair. In an example, via portions 522 and 524 may be connected to the respective signal traces and pads in a substantially similar manner as described above with respect to FIGS. 3 and 4.

In an example, via portion 522 may be a signal via portion such that this via portion may connect electrically and physically a signal trace on the surface of PCB 500 with a signal layer within the PCB. In certain examples, anti-pad or void 570 may be any suitable shape, such as a half circle, a rectangle, or the like. In an example, a size of anti-pad or void 570 may be such that the anti-pad or void is substantially located only around/under via portion 522. In this example, anti-pad or void 570 is located around/under via portion 522 and not around/under via portion 524.

Via portion 532 may be a signal via portion such that this via portion may connect electrically and physically a signal trace on the surface of PCB 500 with a signal layer within the PCB. In certain examples, anti-pad or void 580 may be any suitable shape, such as a half circle, a rectangle, or the like. In an example, a size of anti-pad or void 580 may be such that the anti-pad or void is substantially located only around/under via portion 532. In this example, anti-pad or void 580 is located around/under via portion 532 and not around/under via portion 534.

Figure 6:
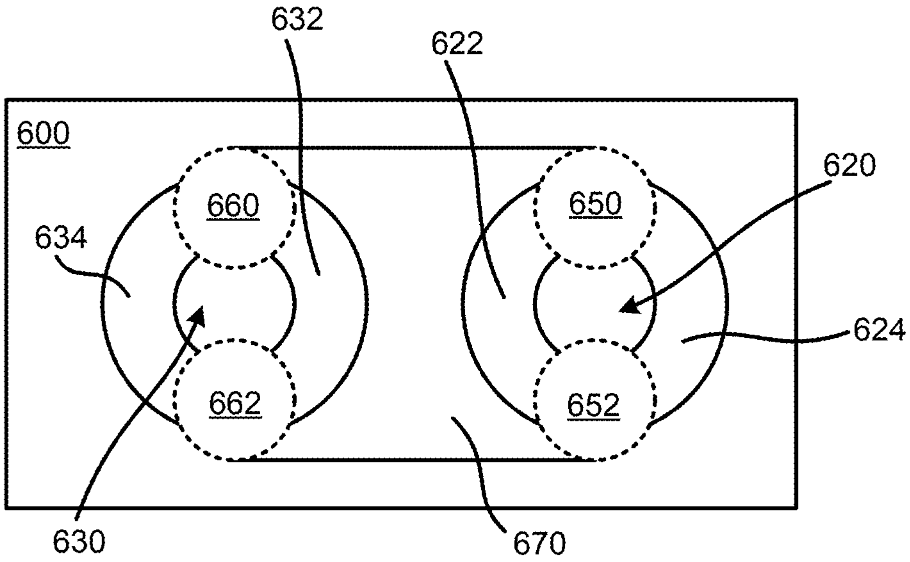
FIG. 6 is a diagram of a portion of a printed circuit board with differential signal vias having an anti-pad or void according to at least one embodiment of the present disclosure.

FIG. 6 illustrates a PCB 600 according to an embodiment of this disclosure. PCB 600 may be substantially similar to PCB 300 of FIGS. 3 and 4. PCB 600 includes vias 620 and 630 and an anti-pad or void 670. Via 620 includes via portions 622 and 624, and via 630 includes via portions 632 and 634. As described above with respect to FIGS. 3 and 4, via portions 622 and 624 may be formed by removing sections 650 and 652 from a conductive plating of via 620. Similarly, via portions 632 and 634 may be formed by removing sections 660 and 662 from a conductive plating of the via. PCB 600 may include additional components without varying from the scope of this disclosure.

Via portion 622 may be connected electrically and physically to a signal trace and a signal pad of a differential pair and via portion 624 may be connected electrically and physically to the other signal trace and signal pad of the differential pair. In an example, via portions 622 and 624 may be connected to the respective signal traces and pads in a substantially similar manner as described above with respect to FIGS. 3 and 4.

Via portion 622 may be a signal via portion such that this via portion may connect electrically and physically a signal trace on the surface of PCB 600 with a signal layer within the PCB. In certain examples, anti-pad or void 670 may be any suitable shape, such as a rectangle or the like. In an example, a size of anti-pad or void 670 may be such that the anti-pad or void is substantially located around/under both of via portions 622 and 632. In this example, anti-pad or void 670 is located around/under via portion 622 and not around/under via portion 624. Additionally, anti-pad or void 670 is located around/under via portion 632 and not around/under via portion 634.

Figure 7:
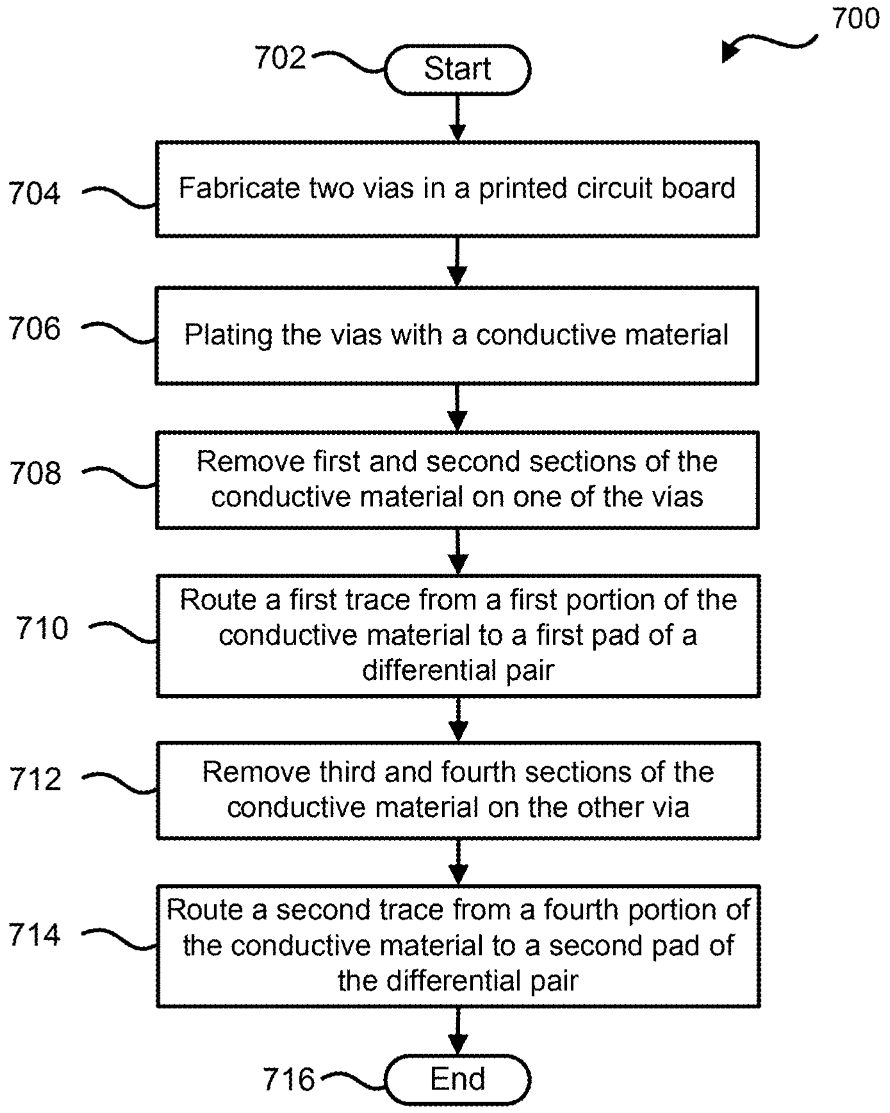
FIG. 7 is a flow diagram of a method for creating two different signal vias and connecting the differential signal vias to pads of a differential pair according to at least one embodiment of the present disclosure.

FIG. 7 is a flow diagram of method 700 for creating two different signal vias and connecting the differential signal vias to pads of a differential pair according to at least one embodiment of the present disclosure, starting a block 702. It will be readily appreciated that not every method step set forth in this flow diagram is always necessary, and that certain steps of the methods may be combined, performed simultaneously, in a different order, or perhaps omitted, without varying from the scope of the disclosure.

At block 704, two vias are fabricated in a PCB. In an example, the vias may be any suitable type of via including, but not limited to, a through hole vias, a micro vias, and a skip vias. At block 706, the vias are plated with a conductive material. In an example, the conductive material may be copper. The details of PCB manufacture, and particularly the forming of vias and traces on a PCB are known in the art and will not be further described herein, except as needed to illustrate the current embodiments.

At block 708, first and second sections of the conductive material plated on one of the vias are removed. In an example, the first and second sections may be removed by any suitable manner, such as drilling the first and second sections out of the conductive material or the like. In certain examples, the removal of the first and second sections may create first and second via portions of the conductive material plated on the via. At block 710, third and fourth sections of the conductive material plated on the other one of the vias are removed. In an example, the third and fourth sections may be removed by any suitable manner, such as drilling the third and fourth sections out of the conductive material or the like. In certain examples, the removal of the third and fourth sections may create third and fourth via portions of the conductive material plated on the via.

At block 712, a first trace is routed from the first via portion of the conductive material on one via to a first pad of a differential pair. At block 714, a second trace is routed from the fourth portion of the conductive material on the other via to a second pad of the differential pair, and the flow ends at block 716. In an example, the electrical communication from the first pad to the first portion of the conductive material of one via through the first trace may provide a first signal path for a differential signal transmitted on the differential pair. The electrical communication from the second pad to the fourth portion of the conductive material on the other via through the second trace may provide a second signal path for the differential signal.

FIG. 8 illustrates a generalized embodiment of an information handling system 800. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below, and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 862, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832, and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 1394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812, or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800. Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board of an information handling system, the printed circuit board comprising:
   - a first via fabricated through the printed circuit board, wherein the first via includes a first conductive metal plating, the first via includes;
     - a first via portion connected to a first ground trace of the printed circuit board; and
     - a second via portion connected to a first trace of a differential pair of the printed circuit board, wherein the first and second via portions are formed in the first conductive metal plating, wherein the first ground trace is located on a first side of the first trace; and
   - a second via fabricated through the printed circuit board, wherein the second via includes
     - a second conductive metal plating, the second via includes;
     - a third via portion connected to a second ground trace of the printed circuit board; and
     - a fourth via portion connected to a second trace of the differential pair of the printed circuit board, wherein the third and fourth via portions are formed in the second conductive metal plating.

2. The printed circuit board of claim 1, wherein first and second sections of the first conductive metal plating is removed to form the first and second via portions.

3. The printed circuit board of claim 2, wherein the first and second sections are removed along a line of symmetry of the first via.

4. The printed circuit board of claim 1, wherein first and second sections of the second conductive metal plating is removed to form the third and fourth via portions.

5. The printed circuit board of claim 4, wherein the first and second sections are removed along a line of symmetry of the second via.

6. The printed circuit board of claim 1, wherein the second ground trace is located on a second side of the second trace.

7. The printed circuit board of claim 1, further comprising:
   - a void section located around the second via portion and not around the first via portion.

8. The printed circuit board of claim 1, further comprising:
   - a void section located around the fourth via portion and not around the third via portion.

9. An information handling system comprising:
   - a printed circuit board including:
     - a first via fabricated through the printed circuit board, wherein the first via includes
       - a first conductive metal plating, the first via includes;
       - a first via portion connected to a first ground trace of the printed circuit board;
       - a second via portion connected to a first trace of a differential pair of the printed circuit board, wherein the first and second via portions are formed in the first conductive metal plating; and
       - a void section located around the second via portion and not around the first via portion; and
     - a second via fabricated through the printed circuit board, wherein the second via includes a second conductive metal plating, the second via includes;
       - a third via portion connected to a second ground trace of the printed circuit board; and
       - a fourth via portion connected to a second trace of the differential pair of the printed circuit board, wherein the third and fourth via portions are formed in the second conductive metal plating.

10. The information handling system of claim 9, wherein first and second sections of the first conductive metal plating is removed to form the first and second via portions.

11. The information handling system of claim 10, wherein the first and second sections are removed along a line of symmetry of the first via.

12. The information handling system of claim 9, wherein first and second sections of the second conductive metal plating is removed to form the third and fourth via portions.

13. The information handling system of claim 12, wherein the first and second sections are removed along a line of symmetry of the second via.

14. The information handling system of claim 9, wherein the first ground trace is located on a first side of the first trace.

15. The information handling system of claim 14, wherein the second ground trace is located on a second side of the second trace.

16. The information handling system of claim 9, further comprising:
   - a void section located around the fourth via portion and not around the third via portion.

17. A printed circuit board of an information handling system, the printed circuit board comprising: a first via fabricated through the printed circuit board, wherein the first via includes a first conductive metal plating, the first via includes; a first via portion connected to a first ground trace of the printed circuit board; a second via portion connected to a first trace of a differential pair of the printed circuit board, wherein the first and second via portions are formed in the first conductive metal plating; and a first void section located around the second via portion and not around the first via portion; and a second via fabricated through the printed circuit board, wherein the second via includes a second conductive metal plating, the second via includes; a third via portion connected to a second ground trace of the printed circuit board; a fourth via portion connected to a second trace of the differential pair of the printed circuit board, wherein the third and fourth via portions are formed in the second conductive metal plating; and a second void section located around the fourth via portion and not around the third via portion.

18. The printed circuit board of claim 17, wherein first and second sections of the first conductive metal plating is removed to form the first and second via portions.

19. The printed circuit board of claim 18, wherein the first and second sections are removed along a line of symmetry of the first via.

20. The printed circuit board of claim 17, wherein first and second sections of the second conductive metal plating is removed to form the third and fourth via portions.

* * * * *